(12) United States Patent
van der Klooster

(10) Patent No.: US 12,719,495 B2
(45) Date of Patent: Aug. 25, 2026

(54) DELTA-SIGMA MODULATORS WITH DOWNSAMPLED DIGITAL INTEGRATORS

(71) Applicant: NXP B.V., Eindhoven (NL)

(72) Inventor: Jan Daniël van der Klooster, Bergeijk (NL)

(73) Assignee: NXP B.V., Eindhoven (NL)

( * ) Notice: Subject to any disclaimer, the term of this patent is extended or adjusted under 35 U.S.C. 154(b) by 123 days.

(21) Appl. No.: 18/942,869

(22) Filed: Nov. 11, 2024

(65) Prior Publication Data

US 2026/0135569 A1 May 14, 2026

(51) Int. Cl.
*H03M 3/00* (2006.01)

(52) U.S. Cl.
CPC ........... *H03M 3/496* (2013.01); *H03M 3/504* (2013.01)

(58) Field of Classification Search
CPC .............................. H03M 3/496; H03M 3/504
USPC .................................................. 341/143, 155
See application file for complete search history.

(56) References Cited

U.S. PATENT DOCUMENTS 7,423,567 B2 * 9/2008 Melanson ............ H03M 3/412 341/143
9,048,861 B2 * 6/2015 Schuurmans ........... H03M 3/39
9,866,238 B1 1/2018 Thomsen et al.
2012/0038500 A1 2/2012 Dijkmans et al.

OTHER PUBLICATIONS

Colodro, F., "Continuous-Time Sigma-Delta Modulator With a Fast Tracking Quantizer and Reduced Number of Comparators", IEEE Transactions on Circuits and Systems—I: Regular Papers, vol. 57, No. 9, Sep. 2010.

Robert Van Veldhoven, et al., "9.8 A Low-Cost 4-Channel Reconfigurable Audio Interface for Car Entertainment Systems," ISSCC 2020 / Session 9 / Noise-Shaping ADCs / 9.8, 2020 IEEE International Solid-State Circuits Conference—(ISSCC), San Francisco, CA, USA, 2020, pp. 168-170, doi: 10.1109/ISSCC19947.2020.9062936.

Feng Chen, et al., "A 0.25-mW Low-Pass Passive Sigma-Delta Modulator with Built-In Mixer for a 10-MHz IF Input," IEEE Journal of Solid-State Circuits, vol. 32, No. 6, Jun. 1997, pp. 774-782, doi: 10.1109/4.585244.

Donghyeok Jeong, et al., "A 4-MHz Bandwidth Continuous-Time Sigma-Delta Modulator with Stochastic Quantizer and Digital Accumulator," IEEE Transactions on Circuits and Systems II: Express Briefs, vol. 66, No. 7, Jul. 2019, pp. 1124-1128, doi: 10.1109/TCSII.2018.2880912.

Sujith Billa, et al., "Analysis and Design of Continuous-Time Delta-Sigma Converters Incorporating Chopping," IEEE Journal of Solid-State Circuits, vol. 52, No. 9, Sep. 2017, pp. 2350-2361, doi: 10.1109/JSSC.2017.2717937.

* cited by examiner

*Primary Examiner* — Khai M Nguyen

(57) ABSTRACT

Systems and methods for delta-sigma modulators with downsampled digital integrators. In various embodiments, a delta-sigma modulator may include: a comparator configured to receive an analog input and to provide a digital output at a sampling frequency, where the digital output is applied to an integrator path and to a feed-forward path; a digital integrator in the integrator path, where the digital integrator is configured to operate with a clock frequency that is less the sampling frequency; and a summer configured to add an output of the integrator path to an output of the feed-forward path to produce a bitstream.

20 Claims, 5 Drawing Sheets

100

400

500

DELTA-SIGMA MODULATORS WITH DOWNSAMPLED DIGITAL INTEGRATORS

FIELD

This disclosure relates generally to electronic circuits, and more specifically, to delta-sigma modulators with downsampled digital integrators.

BACKGROUND

Within the class of analog-to-digital converters (ADC), a category exists which employs oversampling techniques to achieve high-resolution digital outputs. Traditionally, in such ADCs, the analog-to-digital domain (e.g., quantizer(s)) crossing and the digital-to-analog domain (e.g., feedback circuit(s)) employ the same number of levels or bits, where a multi-level approach increases complexity. Alternatively, an approach exists where the number of quantizer levels is less than the feedback levels, however, this has proven difficult to realize due to stability issues.

As the inventor hereof has recognized, ADCs with more feedback levels than quantization levels encounter challenges in maintaining stability, particularly when its digital components operate at the same clock frequency. Conventional solutions, such as analog compensation or digital feed-forward, require significant hardware resources and result in increased noise.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
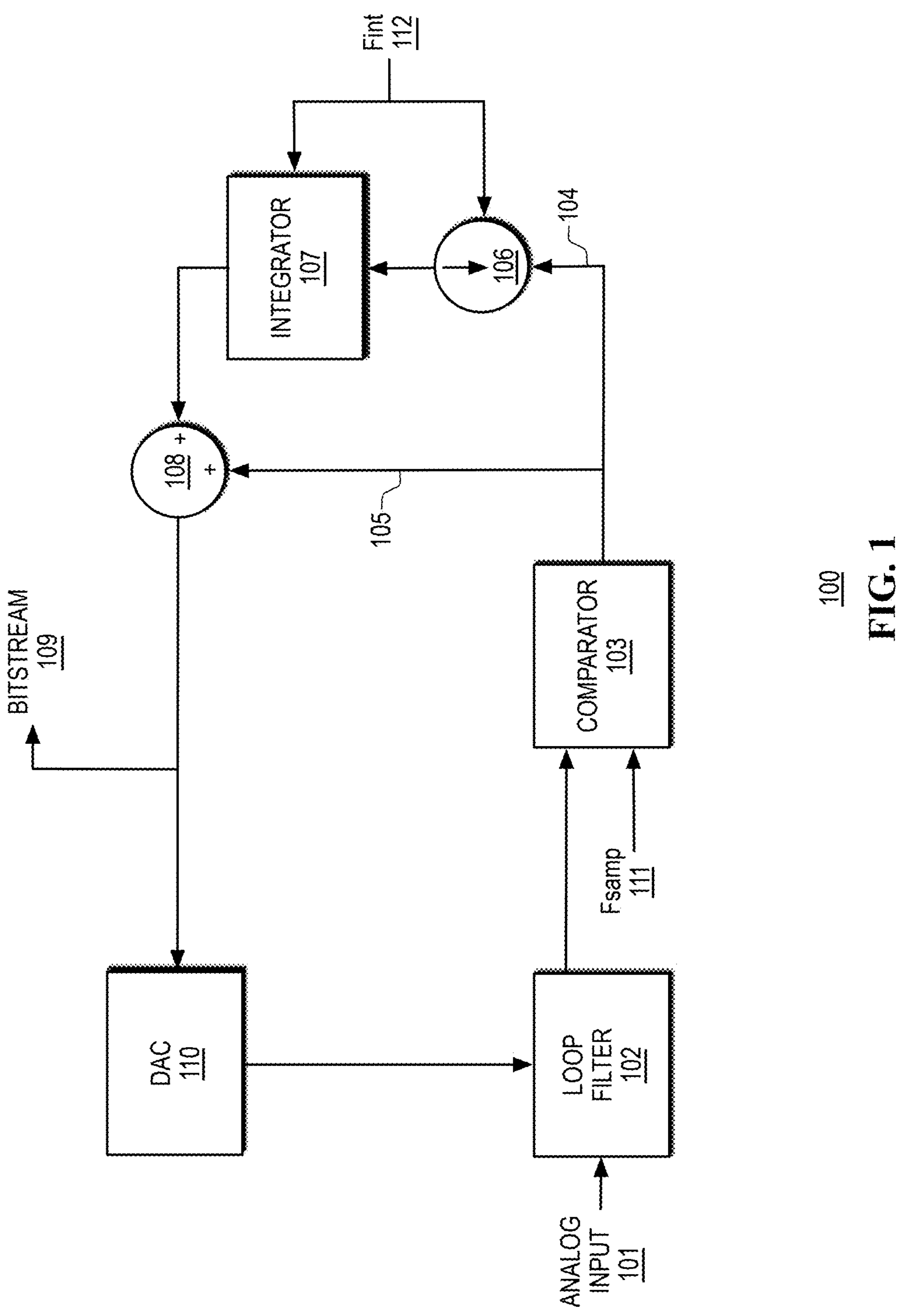
FIG. 1 is a high-level block diagram of an example of a delta-sigma modulator according to some embodiments.

Analog-to-digital converters (ADCs) are essential components in modern electronics, enabling the conversion of analog signals into digital data for processing and analysis. Among the various types of ADCs, delta-sigma modulators are often favored for their ability to achieve high resolution and accuracy through oversampling and noise shaping. These modulators are widely used in applications such as audio processing, telecommunications, and instrumentation, where precision and dynamic range are important, and data rates are typically low.

Conventional delta-sigma modulators utilize a single-bit comparator or quantizer and feedback digital-to-analog converter (DAC) to digitize analog signals through oversampling. While multi-bit comparators can sometimes achieve the same quantization precision with a lower oversampling ratio, they also introduce non-linearity due to mismatches between levels within the comparator and mismatches between levels within the feedback DAC. A digital integrator allows the use of a single-bit comparator, which is inherently linear, but still requires a potentially non-linear multi-bit feedback DAC.

In order to linearize domain crossings (analog-to-digital or digital-to-analog) mismatch shaping techniques may be employed for this purpose, such as Dynamic Element Matching (DEM) algorithms. In many cases linearizing the digital-to-analog crossing in the form of a feedback DAC is simpler than linearizing the analog-to-digital crossing in the form of a comparator. DEM techniques may improve the linearity of a DAC, reducing or minimizing the effects of component mismatches by dynamically selecting and averaging the use of DAC elements over time, thereby effectively spreading mismatch errors across the Nyquist bandwidth.

An advantage of a multi-bit feedback DAC in delta-sigma modulators is its ability to coarsely track the analog input, allowing oversampling without covering the full input range. In current systems, however, multi-bit comparators increase the design complexity of the delta-sigma modulator significantly. Alternatively, in current systems, a digital integrator is used and operated at the same frequency as the comparator, which makes the whole sigma delta loop difficult to stabilize as the integrator introduces a pole in the feedback loop.

The transfer function of a delta-sigma modulator, represented in the discrete and continuous time domains (for z and s, respectively) characterizes how input signals and quantization noise propagate through the system, and it is shaped by strategically placing poles and zeros within the transfer function. Poles (locations in the z or s-domains where the transfer function goes to infinity) are often placed to enhance shape the quantization noise. Zeros (locations in the z or s-domains where the transfer function goes to zero), on the other hand, are selected to control the stability and impulse response of the system.

In the case of a delta-sigma modulator's digital integrator introducing a pole, such pole may be compensated by adding a zero in the digital domain through a feed-forward over the digital integrator. To address this, and other concerns, embodiments of systems and methods described herein may provide an ADC with stable digital integration of reduced hardware complexity, reducing or eliminating the need for analog components to compensate for the pole.

In some embodiments, these systems and methods may introduce a downsampled digital integrator within a delta-sigma modulator's feedback loop. The digital integrator may be sampled at a lower frequency than the delta-sigma modulator's comparator. By adding a digital feed-forward path sampled at the same frequency as the comparator, these systems and methods may compensate for the digital integrator's added pole, thus allowing for fine quantization without the need for an analog zero. In some cases, truncation of the digital integrator's output may also reduce the need for an excessively large feedback DAC.

In many embodiments, these features may improve the flexibility and stability of the delta-sigma modulator, making it particularly suitable for high-resolution applications such as audio codecs and sensor interfaces. The resulting architectures are robust against loop delays and are suitable for high sampling frequencies, offering significant performance improvements, especially for high-resolution applications.

In some cases, use of DEM may further mitigate mismatches in feedback elements, enhancing linearity and precision. By downsampling the digital integrator and employing a feed-forward path, these systems and methods may provide a more efficient and stable solution for ADCs, reducing hardware complexity and improving overall performance.

FIG. 1 is a block diagram of an example of delta-sigma modulator 100. In this embodiment, delta-sigma modulator 100 receives analog input 101 and produces digital bitstream 109. Particularly, analog input 101 is coupled to loop filter 102, which in turn is coupled to comparator 103. The output of comparator 103 includes integrator path 104 and feed-forward path 105.

Integrator path 104 includes downsampler 106 and digital integrator 107. Summer 108 adds the output of feed-forward path 105 to the output of digital integrator 107 to result in bitstream 109. Bitstream 109 is also provided to DAC 110, which tracks analog input 101.

Analog input 101 provides an initial signal to loop filter 102. Loop filter 102 may 25 include, for example, an integrator or low-pass filter that provides a pole at DC or a low frequency. Loop filter 102 may be implemented in either continuous or discrete time. Moreover, loop filter 102 may include second (or higher) order filters. It may also include a passive or active configuration. As such, loop filter 102 processes analog input 101 and sends a resulting, filtered analog signal to comparator 103.

Comparator 103 converts the filtered analog signal into a digital output signal, which is then sent to integrator path 104 and to feed-forward path 105 simultaneously. In different implementations, comparator 103 may be a single bit or multi-bit comparator.

Downsampler 106 downsamples the integrator path 104 data at a lower clock frequency, reducing the bit width of the output of comparator 103 signal, for example, to reduce hardware costs (potentially at the cost of data loss). In some embodiments, however, bitwidth may remain the same after downsampling. Digital integrator 107 operates with the same clock frequency as the downsampler 106.

Digital integrator 107 receives a downsampled digital output from downsampler 106 and increments, holds, or decrements its internal state accordingly. Summer 108 adds the results of the digital integrator 107 and feed-forward path 105 to produce bitstream 109, which represents the digital output of delta-sigma modulator 100.

DAC 110 also receives bitstream 109 and converts it into an analog signal. In some cases, DAC 110 may include a current, resistive, or capacitive type. Moreover, there are at least two ways to scale DAC 110 (where "scaling" refers to how the DAC's digital input values map to specific analog output levels), binary or thermometer, where the former gives a small footprint with large element mismatch and the latter the opposite. Binary scaling assigns each digital bit a weight based on powers of two, making it compact and efficient for high-resolution DACs. Thermometer scaling, by contrast, uses equal-weighted units for each bit, which enhances linearity and minimizes glitches. Hybrid versions may also be implemented, where the most significant bit (MSB) is thermometer scaled and the least-significant bit (LSB) binary. Additionally, this scaling applies for current, resistive and capacitive DACs. Its analog output may then be fed back into loop filter 102, completing a feedback loop.

In delta-sigma modulator 100, loop filter 102 operates in the analog domain. Comparator 103 and DAC 110 convert signals between analog-to-digital and digital-to-analog domains, respectively. Importantly, integrator path 104 and feed-forward path 105 both operate in the digital domain: comparator 103 operates with a clock equal to a sampling frequency $F_{samp}$, while digital integrator 107 operates with a lower frequency $F_{int}$.

In some cases, the operation of downsampler 106 may be defined by a downsampling factor "n" such that $F_{int}=F_{samp}/n$.

Digital integrator 107 may be a simple non-delaying integrator. Additionally, or alternatively, digital integrator 107 may be a delaying integrator. Additionally, or alternatively, digital integrator 107 may be dimensioned with DAC 110 to ensure that its output word does not exceed the DAC's bit capacity after summation by summer 108 with feed-forward path 105.

Digital integrator 107 allows DAC 110 to output a DC feedback signal to compensate for analog input offsets, enabling fine quantization and reducing quantization noise while maintaining a large dynamic range. This may result in reduced ripple on digital integrator 107, as well as benefits to the analog loop filter 102 design, whether in a passive or active configuration.

Figure 2:
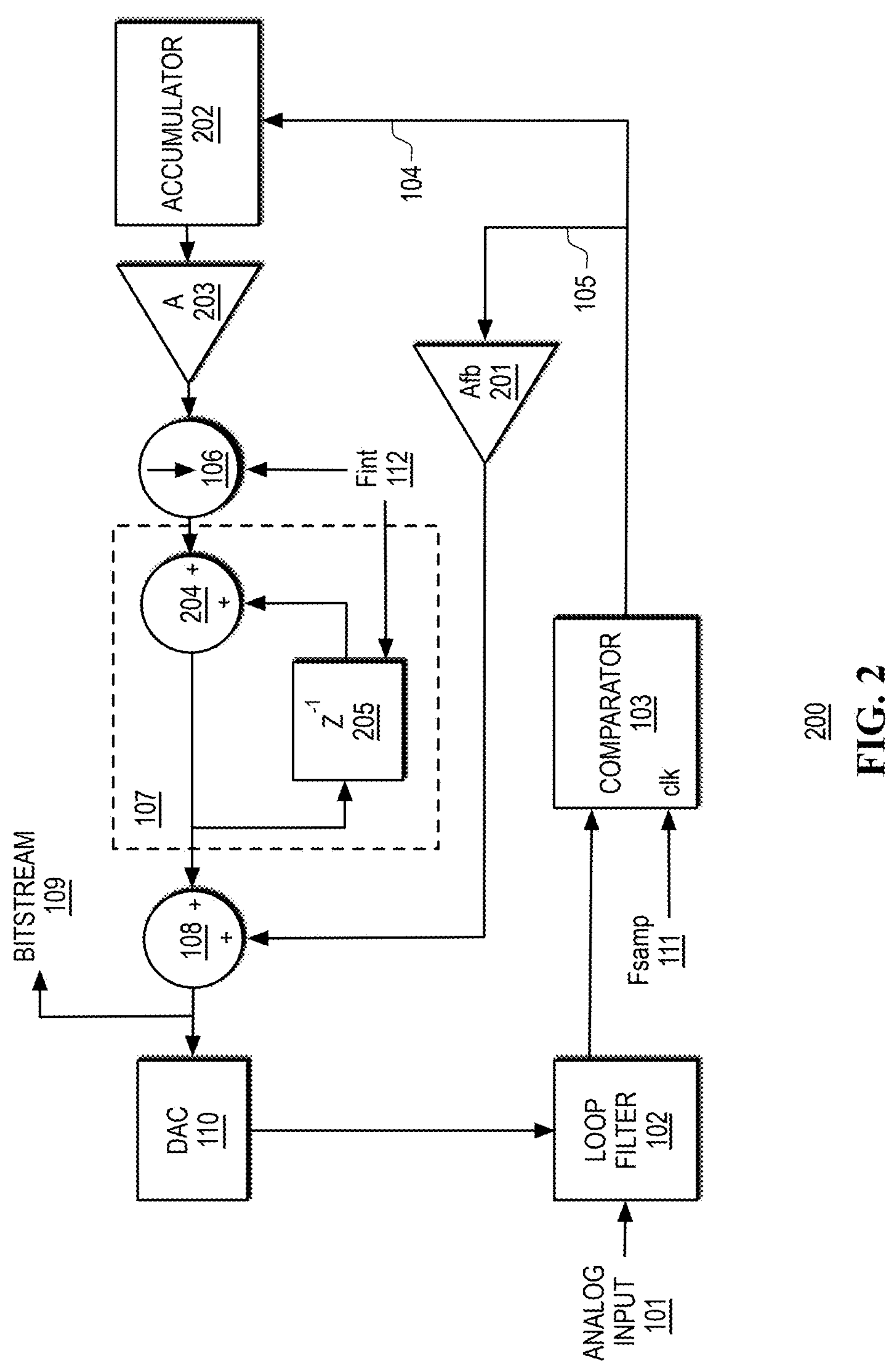
FIG. 2 is a detailed block diagram of an example of a delta-sigma modulator according to some embodiments.

FIG. 2 is a detailed block diagram of an example of delta-sigma modulator 200. In this embodiment, modulator 200 includes digital amplifier (Afb) 201 in feed-forward path 105, and integrator path 104 includes accumulator 202 coupled to digital amplifier (A) 203—both disposed between comparator 103 and downsampler 106. Digital integrator 107 is implemented by summer 204 and flip-flop 205. In various implementations, accumulator 202 may be implemented as Finite Input Response (FIR) filter, or the like, running at $F_{samp}$.

Comparator 103 provides its digital output to accumulator 202 in integrator path 104 and to digital amplifier 201 in feed-forward path 105. In some cases, digital amplifier 201 may add stability to modulator 200, especially when using a feedback DAC. Digital amplifier 201 may provide its output to summer 108.

Meanwhile, accumulator 202 may produce a running sum of input values as its output (e.g., average of last 4 samples), effectively filtering the output of comparator 103 such that only selected frequency components are present. Digital amplifier 203 may normalize the output of accumulator 202 and compensate for filtering losses before the signal is received by downsampler 106, thus producing a running average of the values received by accumulator 202.

Digital integrator 210, operating at $F_{int}$, receives a downsampled digital output from downsampler 106 and increments, holds, or decrements its internal state accordingly. Summer 108 adds the outputs of the integrator path 104 and feed-forward path 105 to produce bitstream 109.

In operation, accumulator 202 provides digital amplifier 203 with information from samples not clocked by digital integrator 107. Particularly, accumulator 202 may sum the previous n samples of the comparator's digital output, expressed as:

$$FIR = \sum_{i=0}^{n} z^{-i}$$

The output of accumulator 202 may be normalized by digital amplifier 203. It may then be truncated to prevent sub-LSB output, as shown in modulator 500 of FIG. 5. Alternatively, truncation may be performed after the digital integrator, as shown in modulator 400 of FIG. 4.

Figure 3:
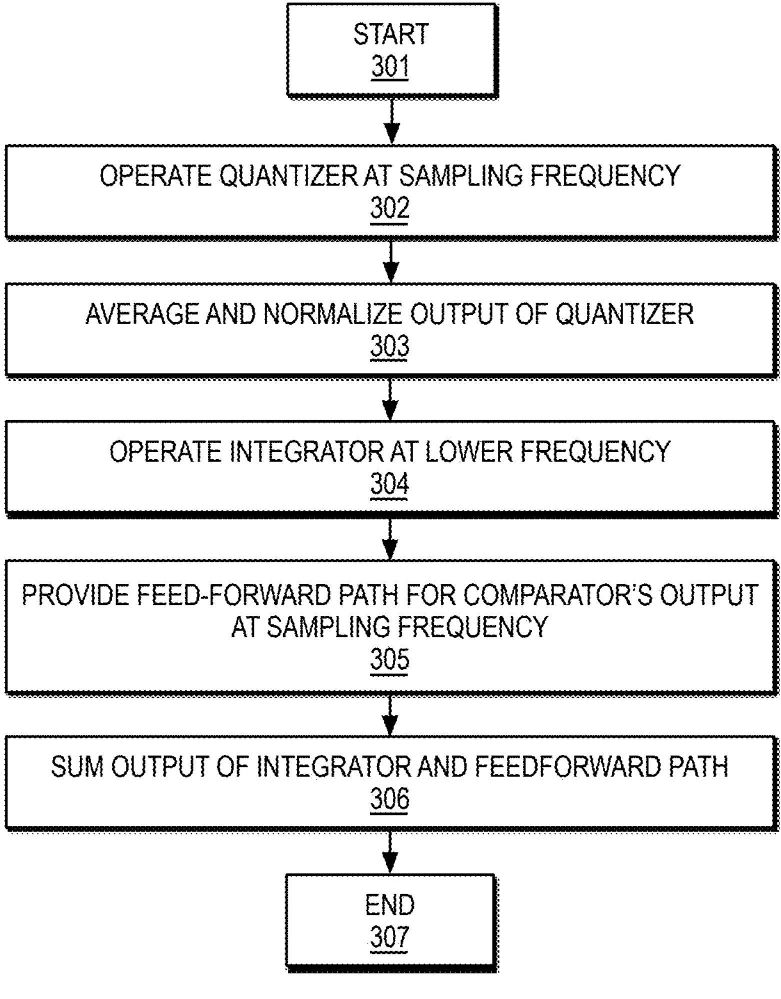
FIG. 3 is a flowchart of an example of a method for operating a delta-sigma modulator according to some embodiments.

FIG. 3 is a flowchart of an example of method 300 for operating digital components of delta-sigma modulator 200. In various embodiments, method 300 may be performed by delta-sigma modulator 200.

Specifically, method 300 begins at 301. At 302, method 300 begins operating comparator 103 at $F_{samp}$. This ensures comparator 103 receives analog input 101 and produces a digital output at a selected sampling frequency.

At 303, method 300 averages and normalizes the output of comparator 103. To that end, the output of accumulator 202 may assume a value (−1, 0, or 1) based upon an accumulation of n samples, including truncation. For example, if n=4, accumulator 202 may output an average of 4 values (upon receipt of the fourth value). In that case, the first three samples are delayed except for the last sample. Then, digital amplifier 203 normalizes the average signal output by accumulator 202 (e.g., dividing the output by 4).

At 304, method 300 operates integrator 107 at a lower frequency $F_n t$, which may reduce circuit complexity and improve stability but adds or moves the pole added by digital integrator 107. In some cases, shifts in clock phase between the different blocks may be implemented to operate the circuit. At 305, method 300 provides feed-forward path 105 for the comparator's output at sampling frequency $F_{samp}$.

At 306, the output of digital integrator 107 and the output of feed-forward path 105 are added by summer 108, such that the former generates a pole compensated by the latter through such summation. This stabilizes the feedback loop by counteracting the effects of the pole introduced by digital integrator 107 through the zero from feed-forward path 105. Method 300 ends at 307.

Figure 4:
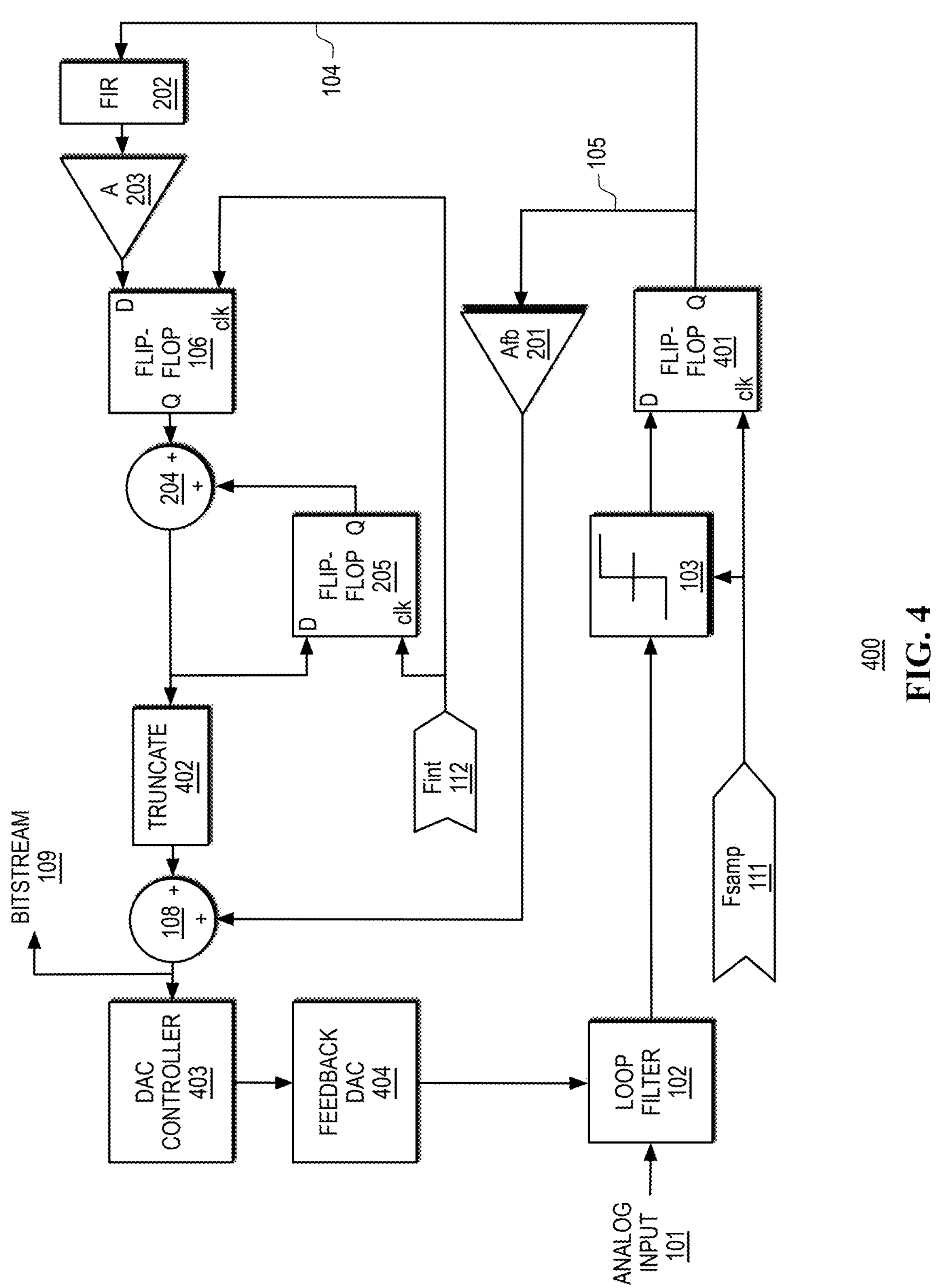
FIG. 4 is a circuit diagram of an example implementation of a delta-sigma modulator according to some embodiments.

To illustrate an implementation of a delta-sigma modulator as described herein, FIG. 4 depicts delta-sigma modulator 400. As shown, delta-sigma modulator 400 receives analog input 101 and produces bitstream 109. Loop filter 102, comparator 103, accumulator (FIR filter) 202, digital amplifiers 201 and 203, flip-flops, latches, or clocked digital cells 106, 205, and 401, summers 108 and 204, $F_{samp}$ 111, $F_{int}$ 112, truncation circuit ("truncate") 402, DAC controller 403, and feedback DAC 404 are coupled as shown. In this embodiment, comparator 103 and flip-flop 401 operate based on $F_{samp}$ 111, whereas flip-flops 106 and 205 operate based on $F_{int}$ 112.

In operation, analog input 101 provides an initial signal to loop filter 102. Loop filter 102 may process analog input 101 and send the filtered signal to comparator 103. Comparator 103 converts the filtered analog signal into a digital output, which is then sent to flip-flop 401. Flip-flop 401 also operates at $F_{samp}$ 111 and provides its output to digital amplifier 201, which passes an adjusted output (with a digital gain) to summer 108 along feed-forward path 105.

In integrator path 104, FIR filter 206 provides a filtered signal (e.g., a running sum of "n" values) to digital amplifier 203, which applies a selected gain to normalize the output of FIR filter 206 (to produce a running average). Flip-flop 106 operating at $F_{int}$ 112 receives the output of digital amplifier 203, downsamples it, and provides the downsampled output to summer 204. Flip-flop 205 is coupled to the output of summer 204 and to one of its inputs, thus serving as digital integrator 107, also operating at $F_{int}$ 112.

Truncator 402 reduces the bit width of the signal to reduce the number of elements needed in the feedback DAC 404. Summer 108 combines the output signal from integrator path 104 to the output signal from feed-forward path 105 to provide bitstream 109 as a digital representation of analog input 101.

DAC controller 403 receives the digital output from summer 108 and modulates the signal before providing it to feedback DAC 404. The modulation may include, for example, DEM and conversion from binary to thermometer encoding. Feedback DAC 404 applies a compensating analog signal to loop filter 102 to complete the feedback loop.

For example, comparator 103 may be a 1 bit quantizer, producing a 1 bit bitstream at $F_{samp}$ of either 0 or 1. Digital integrator 107 may be configured to run at a reduced frequency, $F_{int}$, which in this example is chosen 4 times lower than $F_{samp}$. Accumulator 202 may be implemented as an averaging filter and is given a length of 4, equal to the downsampling ratio.

Using the same implementation as FIG. 4, truncation may be applied after integration, therefore the output of accumulator 101 after normalization in 203 is either [−1, −0.5, 0, 0.5 1]. The number of levels in digital integrator 107 is chosen may be accordance with DAC 110, as the number of levels after summation in 108 should not exceed the number of levels in DAC 110. In this example, DAC 110 may be chosen to be 4 bits, which allows 16 levels. Digital integrator 107 may therefore have 29 levels, such that after truncation of the LSB in 402, 15 levels remain.

Figure 5:
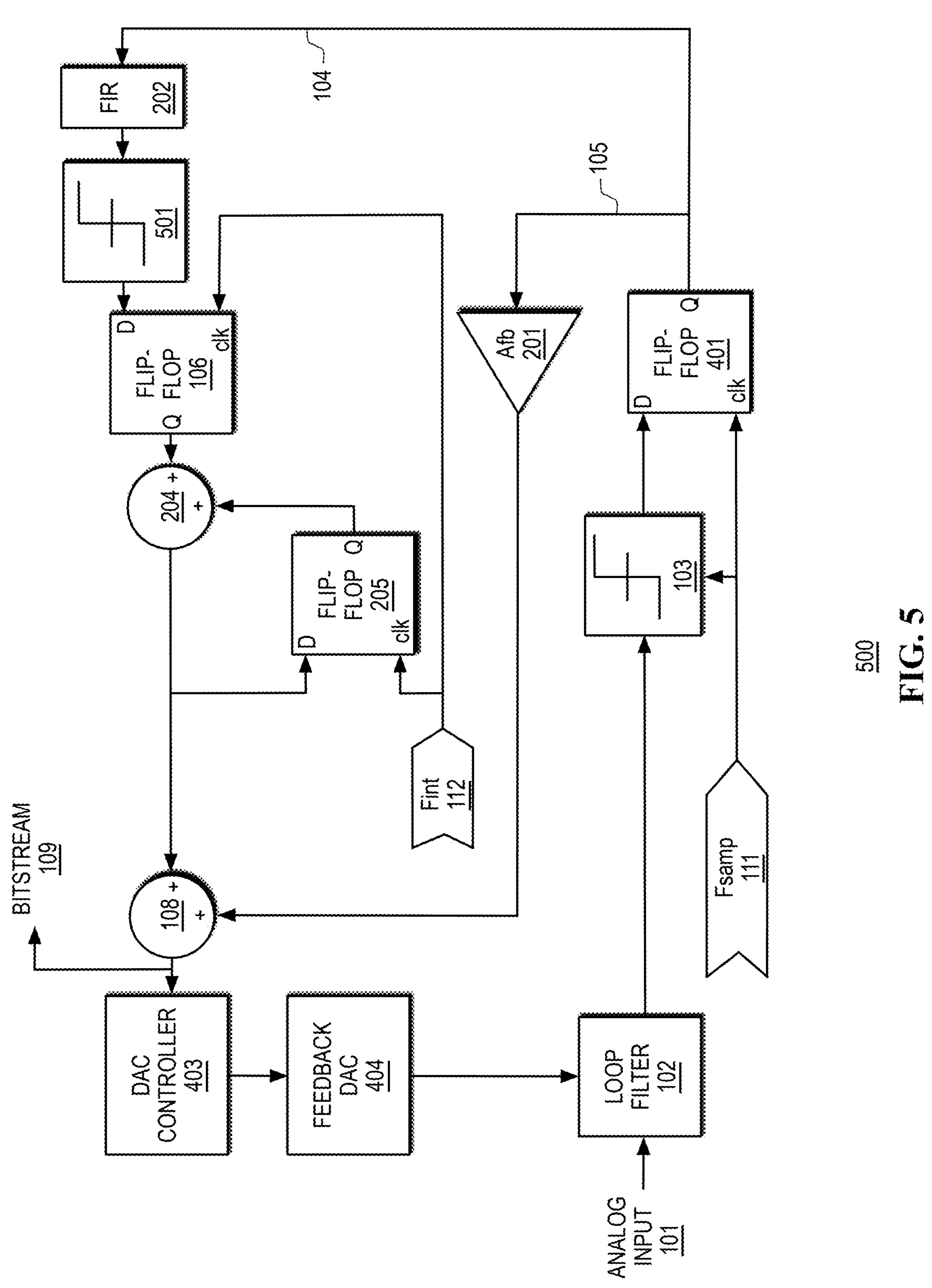
FIG. 5 is a circuit diagram of another example implementation of a delta-sigma modulator according to some embodiments.

An alternative approach is presented in FIG. 5, where truncation is done before downsampling in 106, such that the normalized accumulator output at 203 is [−1, 0, 1]. In this case, the digital integrator 107 may be have 15 levels, such that after summation in 108, it may then have 16 levels, which are presented to DAC 110. In this case, no effective data loss occurs, as feed-forward path 105 is not truncated.

To illustrate another implementation of a delta-sigma modulator as described herein, FIG. 5 depicts delta-sigma modulator 500. As shown, delta-sigma modulator 500 receives analog input 101 and produces bitstream 109. Loop filter 102, comparator 103, accumulator (FIR filter) 202, comparator 501, digital amplifiers 201 and 203, flip-flops, latches, or clocked digital cells 106, 205, and 401, summers 108 and 204, $F_{samp}$ 111, $F_{int}$ 112, DAC controller 403, and feedback DAC 404 are coupled as shown. In this embodiment, comparator 103 and flip-flop 401 operate based on $F_{samp}$ 111, whereas flip-flops 106 and 205 operate based on $F_{int}$ 112.

In contrast with delta-sigma modulator 400 of FIG. 4, modulator 500 includes comparator 501 that truncates the output of FIR filter 202 prior to down sampling by flip-flop 106, such that the output of summer 204 added to the output of digital amplifier 201 matches the number of bits of bitstream 109/DAC controller 403.

Generally, a truncated digital integrator (FIG. 4) may offer better performance than a truncated FIR (FIG. 5), although it may require a larger digital integrator, feasible for small n. Also, in some cases truncation may be made optional, but omitting it may increase the number of elements in DAC 210. As such, modulator 400 may be deemed suitable for handling high-frequency analog input signals 101, as truncation after digital integrator 107 allows for efficient processing of fast-changing inputs (e.g., audio processing, etc.). Conversely, modulator 500 may be deemed suitable for processing DC-type analog input signals 101, as truncation before downsampler 106 enhances performance for signals with slower variations (e.g., sensor data acquisition, where the focus is on capturing steady-state or slowly varying signals, etc.).

In situations where processing speed is prioritized, the order of the accumulator and digital integrator may be reversed. In such architectures, the digital integrator may operate at full speed, receiving an additional gain to manage the increased number of samples compared to other configurations. This gain compensates for the additional samples processed by the digital integrator, ensuring that the output remains consistent with the desired signal characteristics. Following the integration process, the output of the integrator may be truncated. Additionally, or alternatively, the accumulator's output may be truncated.

In various embodiments, implementing a downsampled digital integrator within the feedback loop of a delta-sigma modulator may enhance stability without requiring analog compensation. Downsampling the digital integrator shifts the added pole to a lower frequency, which can be offset by a corresponding digital zero. This design improves loop filter flexibility and enhances stability and robustness, making it suitable for high-resolution applications with reduced hardware complexity. Running the digital integrator at a lower frequency than the comparator reduces hardware and power consumption, making the circuit more efficient.

In an illustrative, non-limiting embodiment, a delta-sigma modulator may include: a comparator configured to receive an analog input and to provide a digital output at a sampling frequency, where the digital output is applied to an integrator path and to a feed-forward path; a digital integrator in the integrator path, where the digital integrator is configured to operate with a clock frequency that is less than the sampling frequency; and a summer configured to add an output of the integrator path to an output of the feed-forward path to produce a bitstream.

The delta-sigma modulator may include a downsampler in the integrator path, where the downsampler is configured to provide a downsampled digital signal at the clock frequency to the digital integrator. Additionally, or alternatively, the delta-sigma modulator may include an accumulator in the integrator path, where the accumulator is configured to receive the digital output and to provide a running sum of the digital output. Additionally, or alternatively, the delta-sigma modulator may include a digital amplifier in the integrator path, where the digital amplifier is configured to normalize a running average of the digital output of the accumulator.

In some cases, the delta-sigma modulator may include an accumulator implemented as a FIR filter. The accumulator may output an average of n values upon receipt of the nth value, and the digital amplifier may be configured to divide the output by n.

The delta-sigma modulator may include truncator coupled between the accumulator and the digital integrator, where the truncator is configured to reduce a bit width of an output of the accumulator. Additionally, or alternatively, the delta-sigma modulator may include a truncator coupled between the digital integrator and the summer, where the truncator is configured to reduce a bit width of an output of the digital integrator. The delta-sigma modulator may also include a digital amplifier in the feed-forward path.

In operation, the integrator path may add a pole to a transfer function of the delta-sigma modulator, and the feed-forward path may add a zero configured to compensate for the pole. Moreover, the comparator may be configured to receive the analog input through a loop filter.

In another illustrative, non-limiting embodiment, a delta-sigma modulator, may include: a comparator configured to receive an analog input; an integrator path configured to receive a digital output of the comparator, where the integrator path comprises a digital integrator configured to operate with a clock frequency smaller than a sampling frequency of the comparator, and where the digital integrator adds a pole to a transfer function of the delta-sigma modulator; and a feed-forward path configured to receive a digital output of the comparator and to compensate for the pole.

The integrator path may include an accumulator configured to receive the digital signal and to produce a running sum of the digital signal, followed by a normalizer configured to produce a average of the accumulator's output. The integrator path may also include a downsampler configured to: receive at least one of: (a) a running average of the digital signal, or (b) a normalized running sum of the digital signal; and provide a downsampled signal to the digital integrator.

In another illustrative, non-limiting embodiment, in an ADC, a method may include: producing a digital output using a comparator operating at a sampling frequency; providing the digital output to an integration path and to a feed-forward path; downsampling the data of the integration path to a lower frequency than the sampling frequency; integrating the data of the integration path with a digital integrator after the downsampling; and combining the integrated downsampled data of the integration path with the digital output to produce a bitstream.

The method may also include the comparator receiving an analog input through a loop filter and producing the digital output based on the analog input at the sampling frequency. In some cases, downsampling the digital output may include downsampling a running average of the digital output.

Downsampling the running average of the digital output may also include: truncating the running average of the digital output; and downsampling the truncated, running average of the digital output. In some cases, the method may include truncating the integrated downsampled data of the integration path after the integration. Additionally, or alternatively, the method may include truncating the integrated downsampled data of the integration path.

In many implementations, systems and methods described herein may be incorporated into a wide range of electronic devices including, for example, computer systems or Information Technology (IT) products; consumer devices or appliances; scientific instrumentation; industrial robotics; medical or laboratory electronics; transportation vehicles such as automobiles, buses, trucks, trains, watercraft, aircraft, etc.; military equipment, etc.

For sake of brevity, conventional techniques have not been described in detail herein. Furthermore, the connecting lines shown in the various figures contained herein have been intended to illustrate relationships (e.g., logical) or physical couplings (e.g., electrical) between the various elements. It should be noted, however, that alternative relationships and connections may be used in other embodiments. Moreover, circuitry described herein may be implemented either in silicon or another semiconductor material or alternatively this can be made with discrete components on a printed circuit board.

Although various systems and methods are described herein with reference to specific embodiments, modifications and changes may be made without departing from the scope of the present disclosure, as set forth in the claims below. Accordingly, the specification and figures are to be regarded in an illustrative rather than a restrictive sense, and all such modifications are intended to be included. Any benefits, advantages, or solutions to problems that are described herein regarding specific embodiments are not intended to be construed as a critical, required, or essential feature or element of any or all the claims.

Reference is made herein to "configuring" a device or a device "configured to" perform some operation(s). This may include selecting predefined logic blocks and logically associating them. It may also include programming computer software-based logic of a retrofit control device, wiring discrete hardware components, or a combination thereof. Such configured devices are physically designed to perform the specified operation(s).

Unless stated otherwise, terms such as “first” and “second” are used to arbitrarily distinguish between the elements such terms describe. Thus, these terms are not necessarily intended to indicate temporal or other prioritization of such elements. The terms “coupled” or “operably coupled” are defined as connected, although not necessarily directly, and not necessarily mechanically. The terms “a” and “an” are defined as one or more unless stated otherwise. The terms “comprise” (and any form of comprise, such as “comprises” and “comprising”), “have” (and any form of have, such as “has” and “having”), “include” (and any form of include, such as “includes” and “including”) and “contain” (and any form of contain, such as “contains” and “containing”) are open-ended linking verbs. As a result, a system, device, or apparatus that “comprises,” “has,” “includes” or “contains” one or more elements possesses those one or more elements but is not limited to possessing only those one or more elements. Similarly, a method or process that “comprises,” “has,” “includes” or “contains” one or more operations possesses those one or more operations but is not limited to possessing only those one or more operations.

The invention claimed is:

1. A delta-sigma modulator, comprising:

a comparator configured to receive an analog input and to provide a digital output at a sampling frequency, wherein the digital output is applied to an integrator path and to a feed-forward path;

a digital integrator in the integrator path, wherein the digital integrator is configured to operate with a clock frequency that is less the sampling frequency; and a summer configured to add an output of the integrator path to an output of the feed-forward path to produce a bitstream.

2. The delta-sigma modulator of claim 1, further comprising a downsampler in the integrator path, wherein the downsampler is configured to provide a downsampled digital signal at the clock frequency to the digital integrator.

3. The delta-sigma modulator of claim 1, further comprising an accumulator in the integrator path, wherein the accumulator is configured to receive the digital output and to provide a running sum of the digital output.

4. The delta-sigma modulator of claim 3, wherein the accumulator comprises a Finite Impulse Response (FIR) filter.

5. The delta-sigma modulator of claim 3, wherein the accumulator outputs an average of n values upon receipt of the nth value, and wherein the digital amplifier is configured to divide the output by n.

6. The delta-sigma modulator of claim 3, further comprising a digital amplifier coupled to the accumulator in the integrator path, wherein the digital amplifier is configured to normalize the running sum of the digital output and to provide a running average of the digital output.

7. The delta-sigma modulator of claim 6, further comprising a truncator coupled between the accumulator and the digital integrator, wherein the truncator is configured to reduce a bit width of an output of the accumulator.

8. The delta-sigma modulator of claim 1, further comprising a truncator coupled between the digital integrator and the summer, wherein the truncator is configured to reduce a bit width of an output of the digital integrator.

9. The delta-sigma modulator of claim 1, further comprising a digital amplifier in the feed-forward path.

10. The delta-sigma modulator of claim 1, wherein the integrator path adds a pole to a transfer function of the delta-sigma modulator, and wherein the feed-forward path adds a zero configured to compensate for the pole.

11. The delta-sigma modulator of claim 1, wherein the comparator is configured to receive the analog input through a loop filter.

12. A delta-sigma modulator, comprising:

a comparator configured to receive an analog input;

an integrator path configured to receive a digital output of the comparator, wherein the integrator path comprises a digital integrator configured to operate with a clock frequency smaller than a sampling frequency of the comparator, and wherein the digital integrator adds a pole to a transfer function of the delta-sigma modulator; and a feed-forward path configured to receive a digital output of the comparator and to compensate for the pole.

13. The delta-sigma modulator of claim 12, wherein the integrator path comprises an accumulator configured to receive the digital signal and to produce a running sum of the digital signal.

14. The delta-sigma modulator of claim 12, wherein the integrator path further comprises a downsampler configured to:

receive at least one of: (a) a running average of the digital signal, or (b) a normalized running sum of the digital signal; and provide a downsampled signal to the digital integrator.

15. In an Analog-to-Digital Converter (ADC), a method comprising:

producing a digital output using a comparator operating at a sampling frequency;

providing the digital output to an integration path and to a feed-forward path;

downsampling the data of the integration path to a lower frequency than the sampling frequency;

integrating the data of the integration path with a digital integrator after the downsampling; and combining the integrated downsampled data of the integration path with the digital output to produce a bitstream.

16. The method of claim 15, further comprising the comparator receiving an analog input through a loop filter and producing the digital output based on the analog input at the sampling frequency.

17. The method of claim 15, wherein downsampling the digital output comprises downsampling a running average of the digital output.

18. The method of claim 17, wherein downsampling the running average of the digital output further comprises:

truncating the running average of the digital output; and downsampling the truncated, running average of the digital output.

19. The method of claim 15, further comprising truncating the integrated downsampled data of the integration path after the integration.

20. The method of claim 15, further comprising truncating the integrated downsampled data of the integration path.

* * * * *